(12) United States Patent
Ausschnitt et al.

(10) Patent No.: US 9,097,989 B2
(45) Date of Patent: Aug. 4, 2015

(54) TARGET AND METHOD FOR MASK-TO-WAFER CD, PATTERN PLACEMENT AND OVERLAY MEASUREMENT AND CONTROL

(75) Inventors: Christopher P. Ausschnitt, Boston, MA (US); Jaime D. Morillo, Beacon, NY (US); Jed H. Rankin, Richmond, VT (US); Roger J. Yerdon, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 1806 days.

(21) Appl. No.: 12/360,132

(22) Filed: Jan. 27, 2009

(65) Prior Publication Data

US 2010/0190096 A1    Jul. 29, 2010

(51) Int. Cl.
*G03F 9/00* (2006.01)
*G03C 5/00* (2006.01)
(Continued)

(52) U.S. Cl.
CPC .............. *G03F 7/70683* (2013.01); *G03F 1/14* (2013.01); *G03F 1/144* (2013.01); *G03F 1/42* (2013.01); *G03F 7/70625* (2013.01); *G03F 7/70633* (2013.01)

(58) Field of Classification Search
CPC ....... G03F 1/14; G03F 1/144; G03F 7/70683; G03F 7/70625; G03F 7/70633
USPC .................................. 430/5, 22, 30; 257/797
See application file for complete search history.

(56) References Cited

U.S. PATENT DOCUMENTS 4,166,219 A    8/1979  Ausschnitt et al.
4,290,384 A    9/1981  Ausschnitt et al.
(Continued)

FOREIGN PATENT DOCUMENTS

JP    61-168227    7/1986
JP    61-170032    7/1986
(Continued)

OTHER PUBLICATIONS

Starikov, Alexander; "Exposure Monitor Structure" Integrated Circuit Metrology, Inspection and Process Control IV, 1990, pp. 315-324.
(Continued)

*Primary Examiner* — Jonathan Jelsma
(74) *Attorney, Agent, or Firm* — DeLio, Peterson & Curcio, LLC; Kelly M. Nowak; Yuanmin Cai

(57) ABSTRACT

A method for mask-to-wafer correlation among multiple masking levels of a semiconductor manufacturing process. The method includes creating compact targets containing structure patterns suitable for pattern placement, critical dimension and overlay measurement at a set of common locations on two or more patterning layers, and creating at least two masks containing functional circuit structure patterns and the compact targets at locations between functional circuit structure patterns. The method then includes measuring the targets, determining overlay variation between the masks, exposing and creating with one mask a first lithographic processing layer on a wafer, and exposing and creating with another mask a second lithographic processing layer on the wafer, over the first layer. The method further includes measuring the targets on the wafer at one or more of the layers, and correlating the mask and wafer measurements to distinguish mask and lithography induced components of critical dimension and overlay variation.

15 Claims, 12 Drawing Sheets

(51) Int. Cl.
*G03F 1/38* (2012.01)
*G03F 7/20* (2006.01)
*G03F 1/00* (2012.01)
*G03F 1/42* (2012.01)

(56) References Cited

U.S. PATENT DOCUMENTS

| | | | |
|---|---|---|---|
| 4,437,760 A | 3/1984 | Ausschnitt | |
| 4,538,105 A | 8/1985 | Ausschnitt | |
| 4,568,189 A | 2/1986 | Bass et al. | |
| 4,890,239 A | 12/1989 | Ausschnitt et al. | |
| 4,898,911 A | 2/1990 | Miyashita et al. | |
| 5,300,786 A | 4/1994 | Brunner et al. | |
| 5,343,292 A | 8/1994 | Brueck et al. | |
| 5,545,593 A | 8/1996 | Watkins et al. | |
| 5,629,772 A | 5/1997 | Ausschnitt | |
| 5,712,707 A | 1/1998 | Ausschnitt et al. | |
| 5,756,242 A | 5/1998 | Koizumi et al. | |
| 5,757,507 A | 5/1998 | Ausschnitt et al. | |
| 5,776,645 A | 7/1998 | Barr et al. | |
| 5,790,254 A | 8/1998 | Ausschnitt | |
| 5,805,290 A | 9/1998 | Ausschnitt et al. | |
| 5,877,861 A | 3/1999 | Ausschnitt et al. | |
| 5,914,784 A | 6/1999 | Ausschnitt et al. | |
| 5,928,822 A | 7/1999 | Rhyu | |
| 5,949,547 A | 9/1999 | Tseng et al. | |
| 5,952,134 A | 9/1999 | Hwang | |
| 5,953,128 A | 9/1999 | Ausschnitt et al. | |
| 5,965,309 A | 10/1999 | Ausschnitt et al. | |
| 5,968,693 A | 10/1999 | Adams | |
| 5,976,740 A | 11/1999 | Ausschnitt et al. | |
| 5,981,119 A | 11/1999 | Adams | |
| 5,985,495 A | 11/1999 | Okumura et al. | |
| 6,003,223 A | 12/1999 | Hagen et al. | |
| 6,004,706 A | 12/1999 | Ausschnitt et al. | |
| 6,020,966 A | 2/2000 | Ausschnitt et al. | |
| 6,027,842 A | 2/2000 | Ausschnitt et al. | |
| 6,042,976 A | 3/2000 | Chiang et al. | |
| 6,061,119 A | 5/2000 | Ota | |
| 6,128,089 A | 10/2000 | Ausschnitt et al. | |
| 6,130,750 A | 10/2000 | Ausschnitt et al. | |
| 6,137,578 A | 10/2000 | Ausschnitt | |
| 6,183,919 B1 | 2/2001 | Ausschnitt et al. | |
| 6,317,211 B1 | 11/2001 | Ausschnitt et al. | |
| 6,335,151 B1 | 1/2002 | Ausschnitt et al. | |
| 6,346,979 B1 | 2/2002 | Ausschnitt et al. | |
| 6,350,548 B1 | 2/2002 | Leidy et al. | |
| 6,417,929 B1 | 7/2002 | Ausschnitt et al. | |
| 6,429,667 B1 | 8/2002 | Ausschnitt et al. | |
| 6,457,169 B1 | 9/2002 | Ross | |
| 6,460,265 B2 | 10/2002 | Pogge et al. | |
| 6,612,159 B1 | 9/2003 | Knutrud | |
| 6,638,671 B2 | 10/2003 | Ausschnitt | |
| 6,766,211 B1 | 7/2004 | Ausschnitt | |
| 6,803,995 B2 | 10/2004 | Ausschnitt | |
| 6,842,237 B2 | 1/2005 | Ausschnitt et al. | |
| 6,869,739 B1 | 3/2005 | Ausschnitt et al. | |
| 6,879,400 B2 | 4/2005 | Ausschnitt et al. | |
| 6,937,337 B2 | 8/2005 | Ausschnitt et al. | |
| 6,975,398 B2 | 12/2005 | Ausschnitt et al. | |
| 7,042,551 B2 | 5/2006 | Ausschnitt | |
| 7,408,642 B1 | 8/2008 | DiBiase | |
| 7,473,502 B1 | 1/2009 | Ausschnitt et al. | |
| 2001/0001900 A1 | 5/2001 | Pogge et al. | |
| 2002/0097399 A1 | 7/2002 | Ausschnitt et al. | |
| 2003/0053057 A1 | 3/2003 | Mishima | |
| 2003/0196185 A1 | 10/2003 | Bruce et al. | |
| 2007/0058169 A1 | 3/2007 | Ausschnitt et al. | |
| 2009/0130570 A1* | 5/2009 | Zhang et al. | 430/5 |

FOREIGN PATENT DOCUMENTS

| | | |
|---|---|---|
| JP | 2-260441 | 10/1990 |
| JP | 10-69066 | 3/1998 |
| JP | 10-213895 | 8/1998 |
| JP | 2001091214 | 4/2001 |
| JP | 2001209167 | 8/2001 |
| JP | 2005512314 | 4/2005 |
| JP | 2005175270 | 6/2005 |
| JP | 2006286747 | 10/2006 |
| WO | WO02/19415 | 3/2002 |

OTHER PUBLICATIONS

"Method for Measuring Semiconductor Lithographic Tool Focus and Exposure", IBM Technical Disclosure Bulletin, Jul. 1987, 2 pages.

Ausschnitt, Christopher P., Cheng, Shaunee Y.; "Modeling for Profile-Based Process—Window Metrology", SPIE5378-5, Feb. 26, 2004, pp. 1-6.

Binns, L.A. et al., Nanometrics; Ausschnitt, C.P., et al. IBM SDRC; "Overlay Metrology Tool Calibration", Proc. SPIE 6518 (2007), 19 pages.

Raugh, Michael R., "Self-calibration of Interferometer Stages: Mathematical Techniques for Deriving Lattice Algorithms for Nanotechnology"; Mar. 2002 (rev. Aug. 2003), 66 pages.

Application No. 2011-546650, JPO Office Action dated Apr. 11, 2013.

PCT/EP2009/067348, PCT Notification of Transmittal of the International Search Report and the Written Opinion dated Jul. 23, 2010, Form PCT/ISA/220.

William H. Arnold, "Towards 3nm Overlay and Critical Dimension Uniformity: an Integrated Error Budget for Double Patterning Lithography", Proceedings of SPIE—The International Society for Optical Engineering, vol. 6924, 2008, pp. 692404-1-692404-9, XP002586487.

Eric P. Solecky, "Simultaneous Critical Dimension and Overlay measurements on a SEM Through Target Design for Inline Manufacturing Lithography Control", Proceedings of SPIE—The International Society for Optical Engineering, vol. 5375, No. Part 1, 2004, pp. 41-50, XP002586488.

* cited by examiner

FIG.4
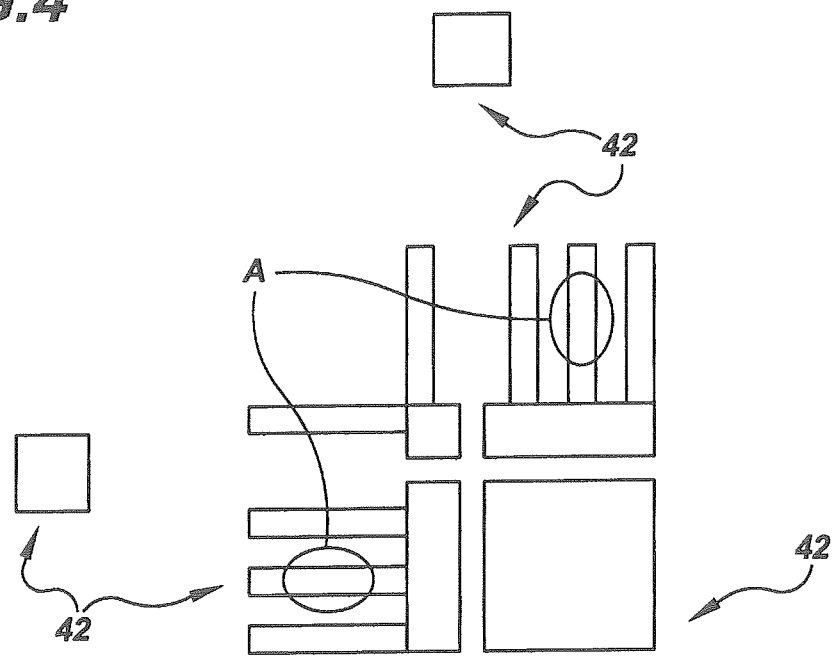
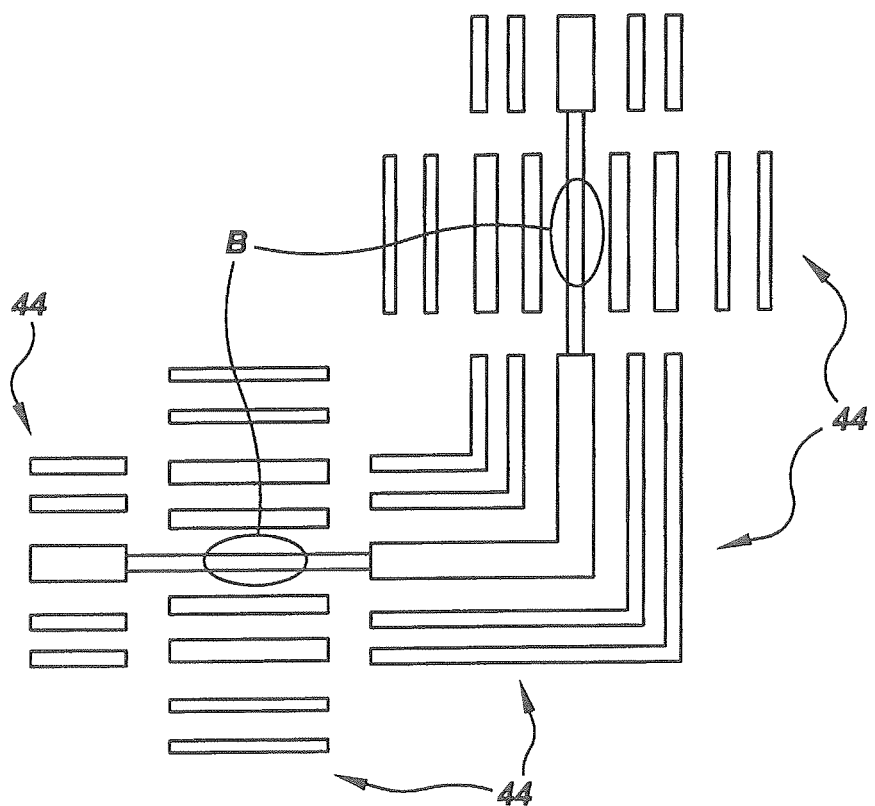

TARGET AND METHOD FOR MASK-TO-WAFER CD, PATTERN PLACEMENT AND OVERLAY MEASUREMENT AND CONTROL

BACKGROUND OF THE INVENTION

1. Field of the Invention

The present invention relates to the manufacture of integrated circuits by a lithographic process and, in particular, to a method and system for determining critical dimension or overlay variation of integrated circuit fields within and between chip levels and layers.

2. Description of Related Art

Semiconductor integrated circuit manufacturing requires the sequential patterning of process levels on a single semiconductor wafer. Exposure tools print multiple integrated circuit patterns or fields by lithographic methods on successive levels of the wafer. These tools typically pattern the different levels by applying step and repeat lithographic exposure or step and scan lithographic exposure in which the full area of the wafer is patterned by sequential exposure of the stepper fields containing one or more integrated circuits. Typically, 20-50 levels are required to create an integrated circuit. In some cases, multiple masks are required to pattern a single level.

Successful fabrication of integrated circuit devices requires the precise and accurate measurements of registration of the mask (reticle) set and overlay placement of mask level to subsequent mask level. Current manufacturing technology uses separate methods of measuring mask registration and wafer level overlay. The use of bar in bar (box in box) and grating targets only allows for the measurement of overlay on the wafer level with no information of mask registration information. Current technology has limited application due to size restriction for placement around the mask reticle field. These targets are also greatly affected by process induced variations given that they are not within the shape pattern densities found within the functioning chip. Hence, these targets are susceptible to chemical mechanical planarization, thermal processing, and lithography image processing.

SUMMARY OF THE INVENTION

Bearing in mind the problems and deficiencies of the prior art, it is therefore an object of the present invention to provide an improved target and method for determination of overlay error within a chip level.

It is another object of the present invention to provide an improved target and method for correlating mask-to-wafer variations of critical dimension and overlay.

A further object of the invention is to provide an improved target and method for distinguishing mask and wafer components of critical dimension and overlay variation.

It is yet another object of the present invention to provide an improved target and method to minimize on-wafer critical dimension and overlay variation.

It is another object of the present invention to provide an improved target and method that measures mask and wafer registration, critical dimension at the same physical location.

Still other objects and advantages of the invention will in part be obvious and will in part be apparent from the specification.

The above and other objects, which will be apparent to those skilled in the art, are achieved in the present invention which in one aspect is directed to a method for mask-to-wafer correlation among multiple masking levels of a semiconductor manufacturing process. The method comprises creating compact targets containing structure patterns suitable for pattern placement, critical dimension and overlay measurement at a set of common locations on two or more patterning layers, and creating at least two masks containing functional circuit structure patterns and the compact targets at locations between functional circuit structure patterns. The method then includes measuring the targets on the masks, determining overlay variation between the masks, exposing and creating with one of the masks a first lithographic processing layer on a wafer, and exposing and creating with another of the masks a second lithographic processing layer on the wafer, over the first layer. The method further includes measuring the targets on the wafer at one or more of the layers, and correlating the mask and wafer measurements to distinguish mask and lithography induced components of critical dimension and overlay variation.

The method preferably further includes using the correlated mask and wafer measurements to control the mask and wafer fabrication processes to minimize wafer critical dimension and overlay variation.

The compact targets preferably include a first set of optical target structures resolvable by optical microscopy when exposed and created on the wafer and a second set of chip-like target structures not resolvable by optical microscopy when exposed and created on the wafer, but resolvable by SEM or AFM microscopy. The first set of optical target structures may be used to measure overlay and the second set of chip-like target structures may be used to measure critical dimension.

The first set of optical target structures may comprise lines on the masks that are adjacent one another when projected by the masks onto the wafer.

The first set of optical target structures may also comprise a first target pattern on one mask having a center at the origin of an orthogonal grid and sub-patterns with 180° symmetry, and a second target pattern on another mask having a center at the same location as the first target pattern and sub-patterns with 180° symmetry, with the sub-patterns of the second target pattern being located at different locations than the sub-patterns of the first target pattern.

The first set of optical target structures may also comprise a first target pattern on one mask having a center at the origin of an orthogonal grid of pitch p, with the sub-patterns of the first target pattern have coordinates of:

(−M, N) p, (N, M) p, (M, −N) p and (−N, −M) p, where N and M are integers, and the distance r of each first target sub-pattern from the center of the first target pattern is defined by the equation:

$$r = p\sqrt{(N^2 + M^2)},$$

and wherein a second target pattern on another mask has a center at the same location as the first target pattern, with the sub-patterns of a second target pattern have coordinates of:

(−M+m, N+n) p, (N+n, M+m) p, (M+m, −N+n) p and (−N+n, −M+m) p, where n and m are integers, and $$|n| + |m| = 2i,$$

where i is an integer.

The second set of chip-like target structures may comprise non-functional structures in the functional circuit structures, such as shallow trench isolation structures, gate structures, contact structures and metal line structures. Preferably, the second set of chip-like target structures have line widths and spacing not greater than about 200 nm, and have a density gradient ranging from a lower density near the optical structures to a higher density away from the optical structures.

The target sub-patterns enable pattern specific critical dimension measurements on the masks and wafer, pattern placement measurements on the masks and overlay measurement between two or more layers on the wafer. The targets should be sufficiently small to be placed within unutilized regions of the chip being manufactured, preferably, less than 10 µm on an edge.

In another aspect, the present invention is directed to a mask having structure patterns for mask-to-wafer correlation among multiple masking levels of a semiconductor manufacturing process. The mask comprises functional circuit structure patterns on the mask in areas corresponding to chips to be made on a wafer and targets on the mask at locations between functional circuit structure patterns. The target containing structure pattern is suitable for pattern placement, critical dimension and overlay measurement at a set of common locations on at least one patterning layer on the wafer. The target structures include a first set of optical target structures resolvable by optical microscopy when exposed and created on the wafer and a second set of chip-like target structures not resolvable by optical microscopy when exposed and created on the wafer, but resolvable by SEM or AFM microscopy.

The targets are located within areas corresponding to chips to be made on the wafer, are sufficiently small to be placed within unutilized regions of the chip being manufactured and are preferably less than 10 µm on an edge. The optical structures are preferably located on opposite sides of the target, and wherein the chip-like structures are located on opposite sides of the target between the optical structures. The first set of optical target structures is typically used to measure overlay and the second set of chip-like target structures is typically used to measure critical dimension.

The first set of optical target structures may comprise lines on the mask. The first set of optical target structures may also comprise a target pattern having a center at the origin of an orthogonal grid and sub-patterns with 180° symmetry. The first set of optical target structures may also comprise a target pattern having a center at the origin of an orthogonal grid of pitch p, with the sub-patterns of the first target pattern have coordinates of:

(−M, N) p, (N, M) p, (M, −N) p and (−N, −M) p, where N and M are integers, and the distance r of each first target sub-patter from the center of the first target pattern is defined by the equation:

$$r = p\sqrt{(N^2 + M^2)}.$$

The second set of chip-like target structures preferably comprise non-functional structures in the functional circuit structures, such as shallow trench isolation structures, gate structures, contact structures and metal line structures. The chip-like target structures preferably have line widths and spacing not greater than about 200 nm and have a density gradient ranging from a lower density near the optical structures to a higher density away from the optical structures.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 4 is a top plan view of embodiments of the STI and gate chip-like structures used in the target of the present invention.

DESCRIPTION OF THE PREFERRED EMBODIMENT(S)

Figure 1:
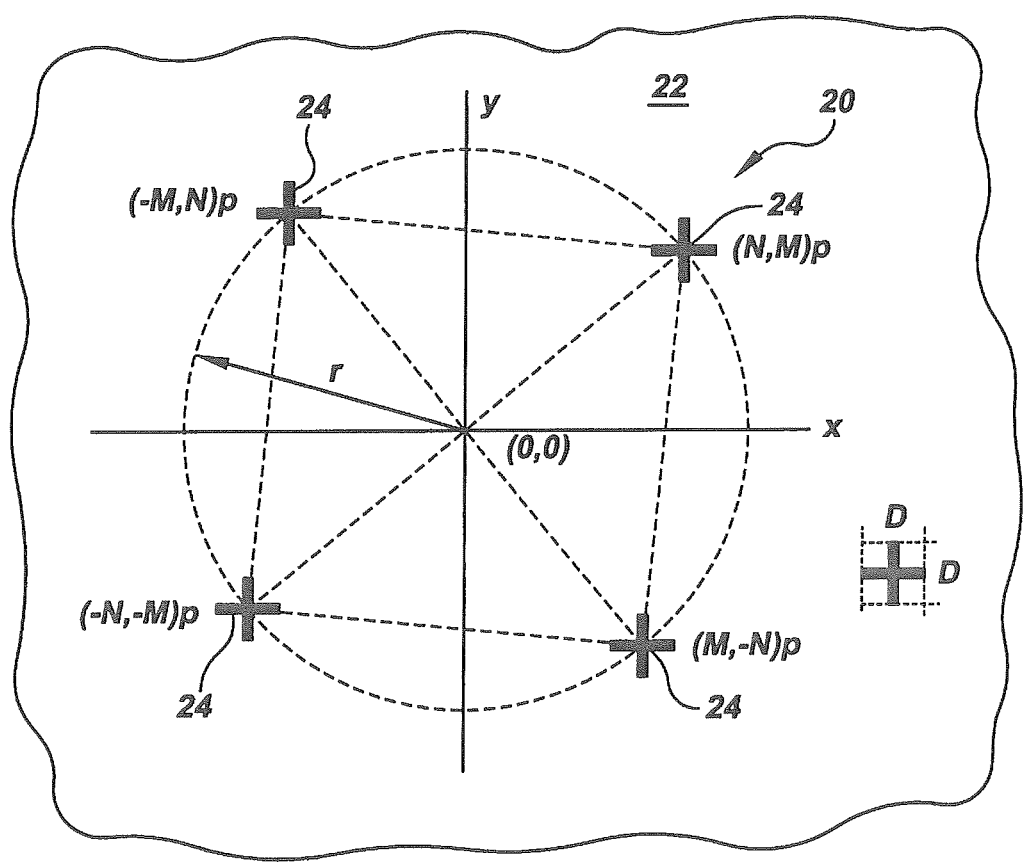
FIG. 1 is a top plan view of the layout on a single lithographic level of one embodiment of blossom sub-patterns in an optical structure used in the target of the present invention.

In describing the preferred embodiment of the present invention, reference will be made herein to FIGS. 1-12 of the drawings in which like numerals refer to like features of the invention.

The present invention provides a target and method for combining both reticle critical dimension (CD) and registration measurement with wafer level or layer overlay measurement in the lithographic production of integrated circuits. The invention allows for precise correlation of wafer level or layer overlay measurements and reticle registration measurements, as well as vastly improving the ability to make thru-field overlay measurements. The invention also provides a method for separating reticle-induced overlay components from wafer exposure-induced overlay errors. This is particularly important because double exposure patterning, where a mask prints first set of lines and then shifts to print a second set of lines, is often used because there is not sufficient resolution to print required pitch in one exposure.

The integrated target of the present invention incorporates both optical structures and chip-like structures. Optical structures are relatively low-resolution, optically-viewable target structures that may be viewed by optical microscopy. Chip-like structures are relatively high resolution structures that mimic the configuration of circuit devices and features found in the functional circuits in the chips formed on the wafer, but are not part of those chip circuits and are non-functional with respect to the operation of the chip. The optical structures are preferably used in the present invention for overlay (OL) and pattern placement (PP) measurements. The chip-like structures are preferably used in the present invention primarily for CD measurement, but may also be used to a limited degree for overlay measurement.

The present invention places the integrated target in unutilized regions of the chip design on the mask, such as in kerf regions and in unused areas of the chip regions. The target structures of the different masks and levels are stacked at common locations. The target structures may be used to correlate pattern placement and wafer overlay measurements, correlate mask CD and wafer CD measurements, determine any mask component of critical dimension and overlay variation and determine lithographic process induced deviations of same. The ultimate goal is to minimize wafer critical dimension and overlay variation between the different process levels and layers.

One type of optical target is the blossom target disclosed in U.S. Ser. Nos. 11/162,506 and 11/833,304, the disclosures of which are hereby incorporated by reference. The blossom target system places a plurality of sub-patterns or petals at a constant radial distance about a common center, such that the sub-patterns are symmetric about a target pattern center and preferably define the corners of a geometric shape, more preferably a square. Other geometric shapes may also be used, with the sub-patterns located at the corners of the shapes. The sub-patterns can be any feature or combination of features that is symmetric about the X-Y axes, such as a cross, circle, square, square grid, and the like. The cross is the simplest among the sub-pattern options. Each sub-pattern or petal has a unique x-y location. The center of symmetry of each petal or sub-pattern may be determined by optical microscopy, although higher resolution scanning electron microscope (SEM) and atomic force microscopy (AFM) can also be used.

As shown in FIG. 1, one group 20 of blossom target petals is shown on lithographic level 22. Target pattern group 20 forms a square superimposed over a regular orthogonal grid of pitch p. Sub-pattern petals 24 comprise cross shapes located symmetrically about the target center (0, 0), here shown at the corners of the square. The length of the line segments making up the sub-pattern petal crosses is shown as dimension D. The x-y location of each petal from the center of the square are integer multiples (N, M) of p. The centers of the petals are located at a distance, radius r, from the center of the target group:

$$r = p\sqrt{(N^2 + M^2)}$$

Figure 2:
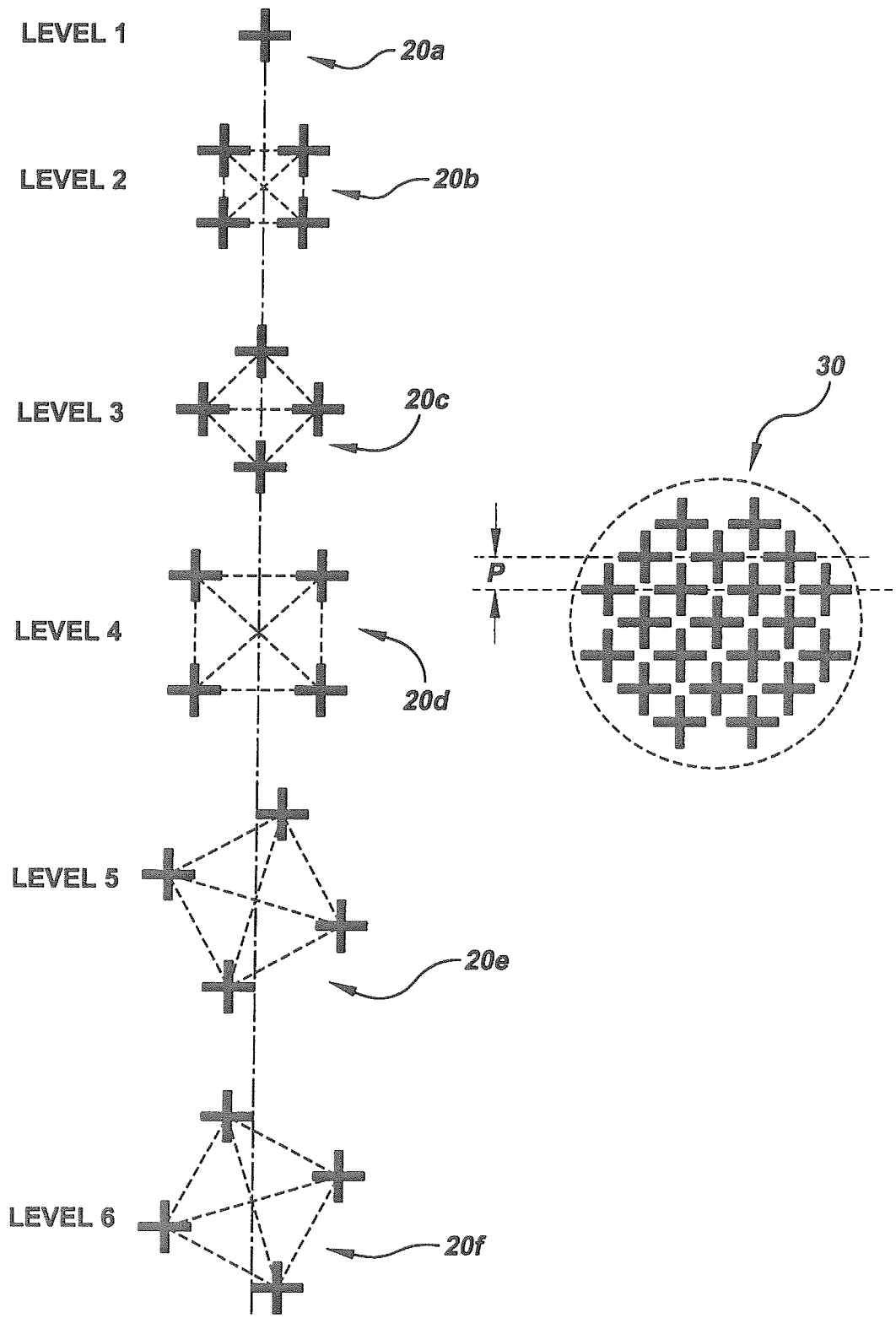
FIG. 2 is a top plan view of the layout on successive lithographic levels 1 through 6 of the blossom optical structures of the type shown in FIG. 1 used in the target of the present invention.

Each group of petals corresponds to a different lithographic level or layer. As the target groups are created on each of the different lithographic levels or layers containing the other portions of the integrated circuit, the (N, M) values are preferably incremented by integers (n, m). As used herein, the term lithographic level refers to the physical level as seen in vertical cross-section of the wafer. The term layer refers to the different mask exposures during lithographic processing. A lithographic level may have only one layer if only one mask exposure level is required to produce the level. On the other hand, it is common to require more than one mask exposure or layer to create the circuit images on each lithographic level. In this blossom target system, each level or layer corresponds to unique values of (N, M). Radial symmetry of the petal group is maintained at each level or layer. The radii of the petals may be the same or different for each lithographic level or layer and the centers of the petals of each group on each layer define a unique radius for the group on a layer. Under the constraint that the sum of the absolute values of the increments are even, i.e, $$|n| + |m| = 2i$$

for integer i, superposition of the sub-patterns over multiple layers defines an overlay target in the form of a close-packed diagonal array. As shown in FIG. 2, target pattern groups 20a, 20b, 20c, 20d, 20e and 20f are formed on lithographic levels 1, 2, 3, 4, 5 and 6, respectively. The target group of level 1 is a single sub-pattern petal at the center of the overlaid array of groups on levels 2-6, which are formed in a square pattern as describe above. The individual targets 20a, 20b, 20c, 20d, 20e and 20f are located on their respective layers so that they would all have the same center location if the layers were perfectly aligned. Instead of being located on different levels, some of the targets may be overlaid from different mask patterns layers in different fields lithographically formed on the same level. Each of the target pattern groups 20a, 20b, 20c, 20d, and 20e is incremented from the one preceding it in the manner described above. After the successive lithographic levels or layers are formed over one another, the target pattern groups are overlaid on one another as shown by combined blossom target pattern array 30. The cross sub-patterns do not overlap in the array provided the cross dimension D<2p.

Each of the square target groups in FIGS. 1 and 2 have 90° symmetry, i.e., they are invariant to rotations of 90°. Instead of this 90° symmetry, the optical structure of the target of the present invention may use blossom target groups with 180° symmetry, also known as microblossom targets. As shown for microblossom target 30a in FIG. 3, center cross petal 24a is on level 1 and is a group of one, while petals 24b are a group on level 2 and cross petals 24c are a group on level 3. Here, the group of petals 24b are on set of opposite corners of a square, while the group of petals 24c are on the other set of opposite corners of the same square. In this case, the radii of petals 24b, 24c is the same, and does not have to increment between level 2 and level for the groups. The groups of petals 24b and 24c each have 180° symmetry, i.e., they are invariant to rotations of 180°. As before, instead of being located on different levels, the groups of petals 24a, 24b and 24c for the microblossom target may be one or more layers create by one or masks on the same lithographic level.

The preferred level or layer alignment measurement method consists of determining the center of each petal, then using those sub-pattern centers to determine the center of the group of petals at each level or layer, and then determining the pair-wise difference in x and y values among the centers of all of the groups to determine alignment error between the targets on the lithographic levels or layers. Instead of the blossom targets, the optical targets may be other optical shapes, such as more simple lines and crosses.

The preferred chip-like structures used in the target of the present invention are those that resemble functional circuit or device structures such as shallow trench isolation structures (RX), transistor gates (PC), contacts (CA) and metal lines (M1). FIG. 4 shows preferred shallow trench isolation structures 42 and gate structures 44 as examples of these chip-like structures. Both structures comprise spaced-apart lines of given width, typically of critical dimension. In the examples shown, A shows the measurement of nominal linewidth, e.g., 80 nm, and nominal space width between lines, e.g., 90 nm in the circled areas of the RX shallow trench isolation structures, and B shows the measurement of nominal linewidth, e.g., 52 nm, and nominal space width, e.g., 88 nm in the circled areas of the PC transistor gate structures. Preferred chip-like contact structures and metal structures are of similar configuration and size. For each chip-like structure, the integrated target includes a corresponding optical structure on the same mask and process layer.

The order of these chip like structures reflects normal front end of line (FEOL) lithographic process ordering on different levels. The size of these structures as exposed and produced on the wafer should be sufficiently small to determine CD and overlay errors by the mask and/or lithographic processing. The minimum linewidth dimensions of these features are preferably in the range of about 20 to 200 nm. The structures generally cannot be seen by optical microscopy, and require higher resolution methods such as SEM or AFM for measurement. The maximum density of these chip-like structures in the target is determined by the minimum pitch, which is on the order of twice the minimum linewidth dimension. This density is important in the preferred embodiment of the integrated target system of the present invention, wherein the chip-like structures have a density gradient that generally increases from a minimum density near the center of the target to a maximum density near the edges of the target away from the center.

Figure 5:
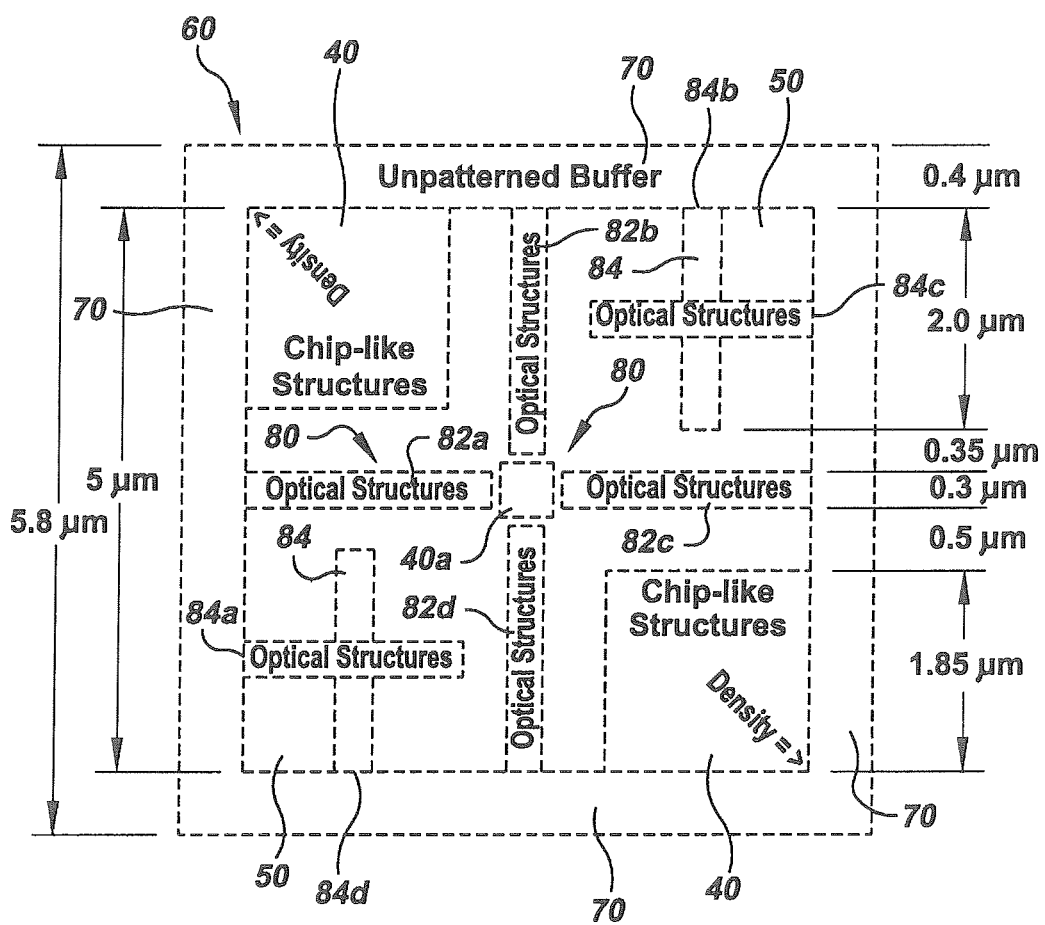
FIG. 5 is a top plan view of the a preferred integrated target of the present invention using a combination of both optical and chip-like structures.

A preferred integrated target 60 is shown in FIG. 5, which combines the individual optical and chip-like structures for all desired levels and layers. Preferably the chip-like structures are placed in square fields 40 in the quadrants at one set of opposite diagonal corners of the target and in the center of the target, and the optical structures are placed in square fields 50 in the quadrants at the other set of opposite diagonal corners, as well as in the boundaries between these quadrants and fields. The preferred dimension of the integrated target is less than 10 μm, preferably in the range of 2-10 μm square, and is about 5.8 μm as shown. The remaining preferred dimensions are shown.

The center cross 80 is an optical structure that comprises horizontal 82*a*, 82*c* and vertical 82*b*, 82*d* arms along the boundaries between the four quadrants of the target 60. The center region between the arms 82*a*, 82*b*, 82*c*, 82*d* is left open for a square field 40*a* that may contain low density chip-like structures or other target structures. Optical structure fields 50 contain either the blossom target or microblossom target described above, or other optical structures such as crosses 84. Crosses 84 are oriented to have ends of the cross lines 84*a*, 84*b*, 84*c*, 84*d* end at the outer peripheries of the fields 50. As will be described in more detail below, the elements of optical cross 80, as well as optical crosses 80, 84 themselves, may be stacked on alternate lithographic levels to enable overlay metrology among more than two levels.

Optical proximity correction (OPC) techniques are used on chip-like structures only. Preferably, the density of the chip-like structures in fields 40 increases on the diagonal toward the perimeter to minimize proximity effects on center cross 80 and crosses 84 and otherwise prevent interference with the optical structures in the target.

Buffer regions 70 are provided on the periphery of target 60 to minimize proximity effects from adjacent structures on the mask and enable pattern recognition during microscopic measurement of the target. The buffer regions have a desired width, here shown as about 0.4 μm, and have no target or other features therein. The location of the opposite quadrants of chip-like fields 40 and optical structure fields 50 provide diagonal and radial symmetry to nullify any proximity effect on overlay measurement metrology.

Figure 6:
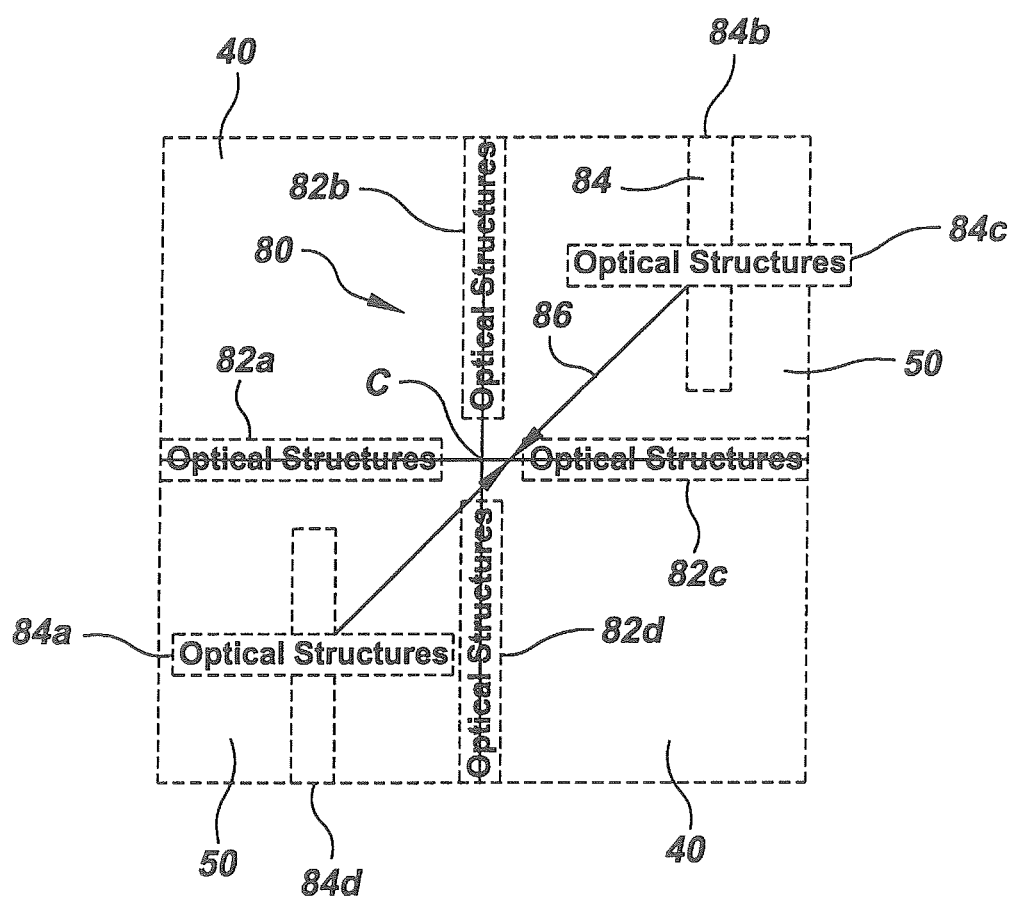
FIG. 6 is a top plan view of the optical structures of the target of FIG. 5.

FIG. 6 shows only the optical structure portions of integrated target 60 as used for wafer level overlay measurements. To project the images, a first mask is created to project cross 80, made up of radially outward extending segments 82*a*, 82*b*, 82*c* and 82*d* oriented along the X- and Y axes with a center point C. A second mask is created to project diagonally opposed crosses 84, and is designed so that the outer ends thereof end at the peripheries of field 50 and a connecting line between the centers thereof passes through the same center C as the first mask. In both masks, chip-like features (not shown) are preferably created on the other diagonal fields 40 and optionally in the center between the cross arms.

Figure 7:
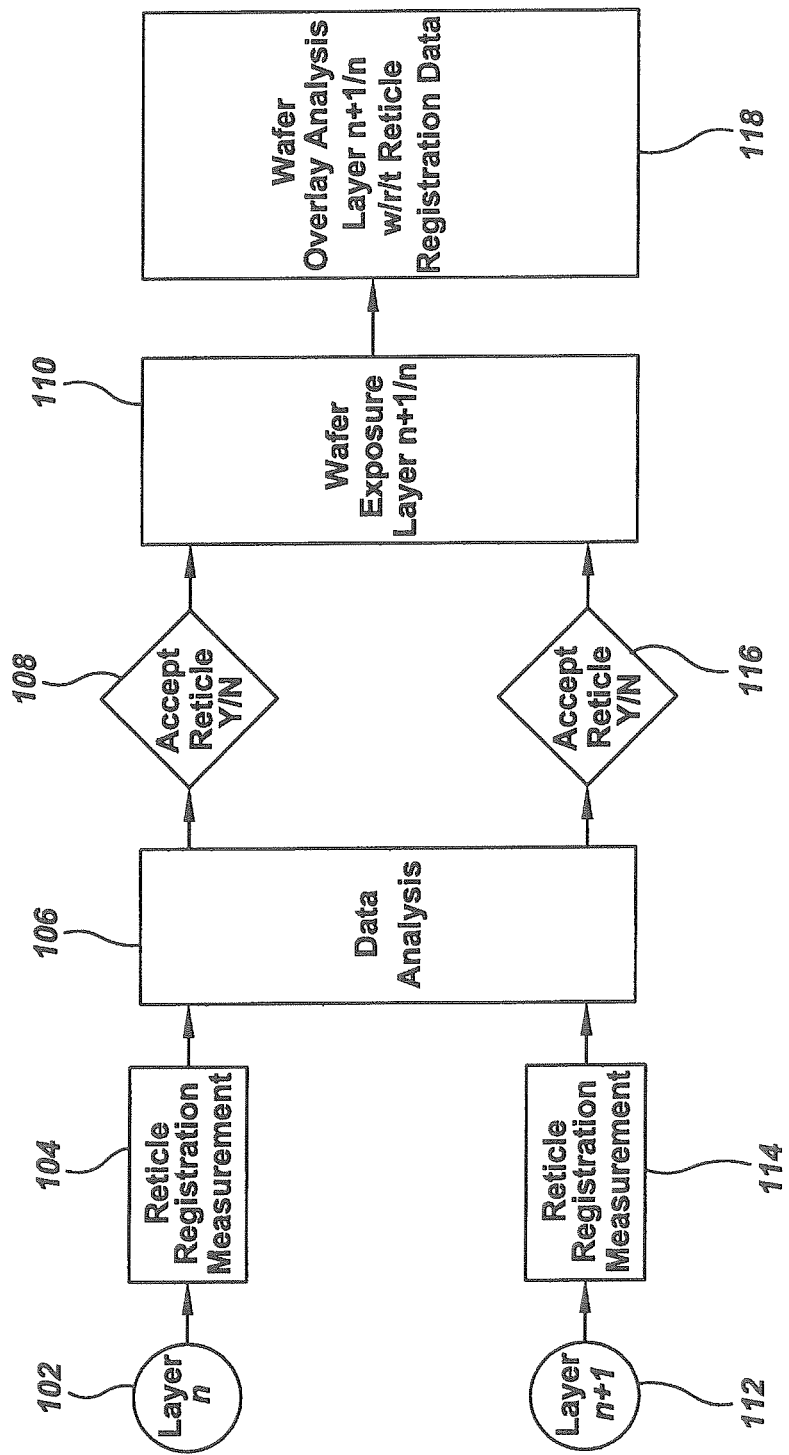
FIG. 7 is a flow chart of the preferred method of determining pattern placement and overlay error for masks and wafer layers in accordance with the present invention.

In use to control mask fabrication, a simulated exposure of the two masks is made sequentially by a system that uses an interferometric stage. The method is shown in FIG. 7, where the exposure of cross 80 is simulated by a level 1 (or layer n) mask, 102. At the same time, RX chip-like structures (not shown) in fields 40 are also exposed in the simulation. A level 2 (layer n+1) mask then simulates exposure 112 of the pair of crosses 84 in diagonally opposite fields 50, and, at the same time, PC chip-like structures (not shown) in fields 40. The pattern placement is then measured for the level 1 mask 104 and the level 2 mask 114 by data analysis 106 which subtracts the pattern of one mask from the pattern of the other mask. Because the level 2 mask was designed to have the connecting line 86 between the centers of crosses 84 pass through the same center C of cross 80, any pattern placement error will be noted if the this does not occur. In the example shown in FIG. 6, an overlay shift in the X-direction is seen because the centerline connector 86 does not pass through center C and by the shift of cross ends 84*a*, 84*c* rightward so as to not be in contact with the peripheries of fields 50. The degree of shift may be determined by either the degree of shift of the cross ends from the field peripheries, or the distance of intersection of line 86 from center point C, or both. At the same time, CD and pattern placement may be determined by measurement of the chip-like structures patterns on and between the two masks by otherwise conventional methods. The decision is then made to accept the masks, 108, 116, and any errors in pattern placement and CD may then be corrected on one or both of the masks before thy are placed into production.

In use to control wafer fabrication, cross 80 and the RX chip-like structures (not shown) in fields 40 are exposed by the level 1 mask 110 (FIG. 7) and printed on a photoresist layer, and then etched on level 1 of a wafer. For the next level, a level 2 mask exposes the pair of crosses 84 in diagonally opposite fields 50 along with the PC chip-like structures (not shown) in fields 40, and the images are printed into a photoresist layer for level 2 of the wafer. The same techniques as described above are used to determine overlay between the level 1 and level 2 optical structures and chip-like structures. CD may also be measured on the chip-like structures after each lithographic printing and etching. The wafer overlay analysis 118 (FIG. 7) compares the placement of the targets between levels 1 and 2, and with respect to the mask registration data obtained previously. Any errors in overlay and CD may then be corrected on each wafer level, after printing and after etching, before the next level or layer is created.

Figure 8:
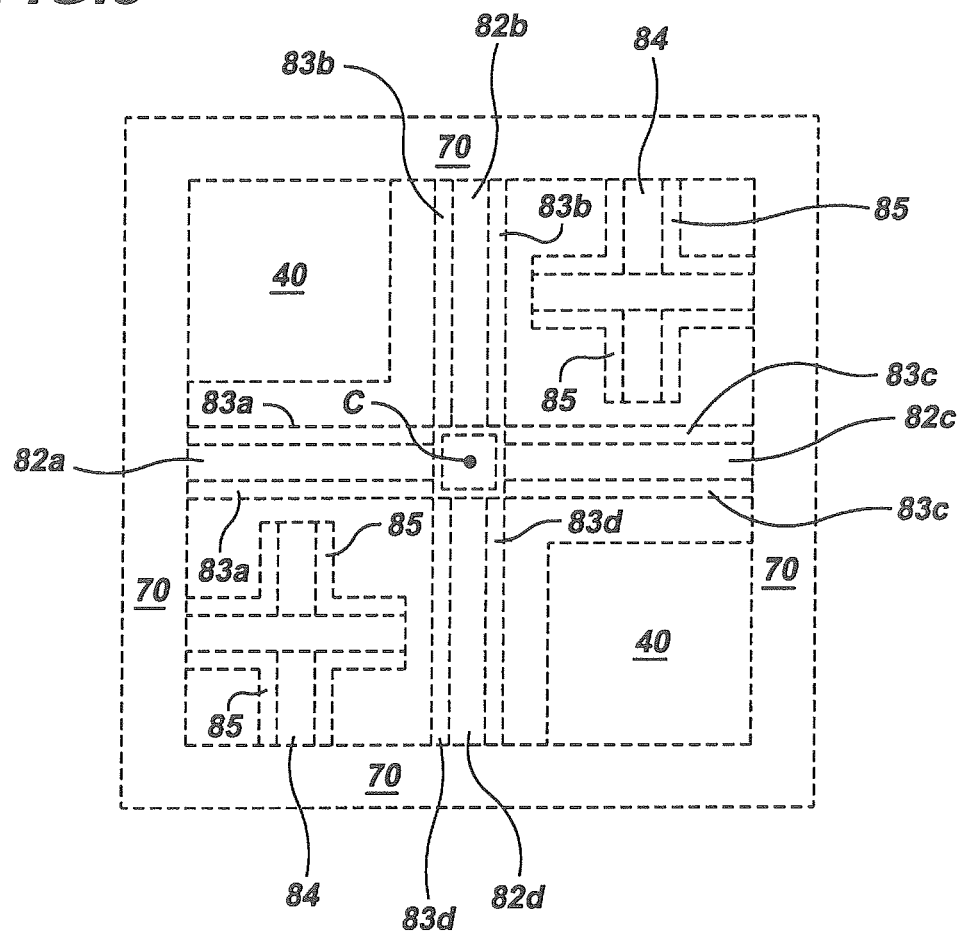
FIG. 8 is a top plan view of overlaid optical structures of the present invention after processing of four different masks and lithographic layers.

Further target configurations are shown in FIG. 8 for the optical structures in subsequent masks and wafer levels or layers. A target for the next lithographic level 3 may include an optical structure that corresponds to original cross 80, but has pairs of arms 83*a*, 83*b*, 83*c* and 83*d* parallel to and abutting on either side of the location of arms 82*a*, 82*b*, 82*c* and 82*d*, respectively. The center of cross arms 83*a*-*d* coincides with center C of crosses 80 and 84. CA chip-like structures (not shown) may be located in field 40 for the target for level 3. In the target for level 4, cross arms 85 are located parallel to and abutting on either side of the location of the arms of crosses 84, and M1 chip-like structures (not shown) may be located in field 40. Masks are created with the optical and chip-like structures for the level 3 and 4 targets. The measurement of CD and pattern placement errors for the masks for levels 2 and 3, and then for levels 3 and 4, are made as described above and in FIG. 7. After the masks are corrected or otherwise accepted, the wafer layers are exposed, printed and etched, and the CD and overlay errors are measured as described above and in FIG. 7 for wafer levels 2 and 3, and then for wafer levels 3 and 4.

Figure 3:
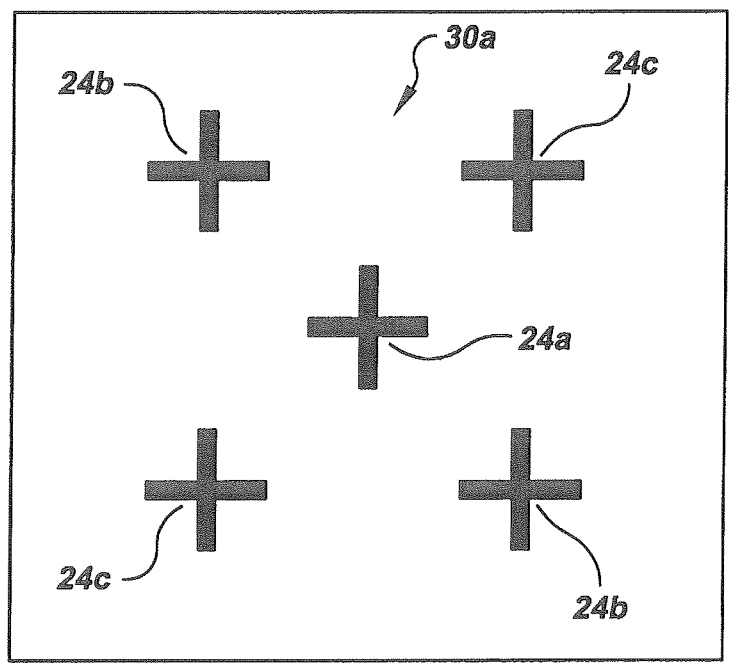
FIG. 3 is a top plan view of the layout from three different lithographic levels of microblossom optical structures used in the target of the present invention.

As indicated above, instead of the relatively large stacked cross structures 82a-d, 83a-d, 84 and 85 shown in FIG. 8, the separated blossom or microblossom targets of FIGS. 2 and 3, respectively, may be used for the optical structures in the integrated target of the present invention. The separated blossom targets generally require more area on the target, but can be used to show more processing layers on the combined target. The stacked cross structures generally require a smaller target area, but can show fewer processing layers.

Figure 9:
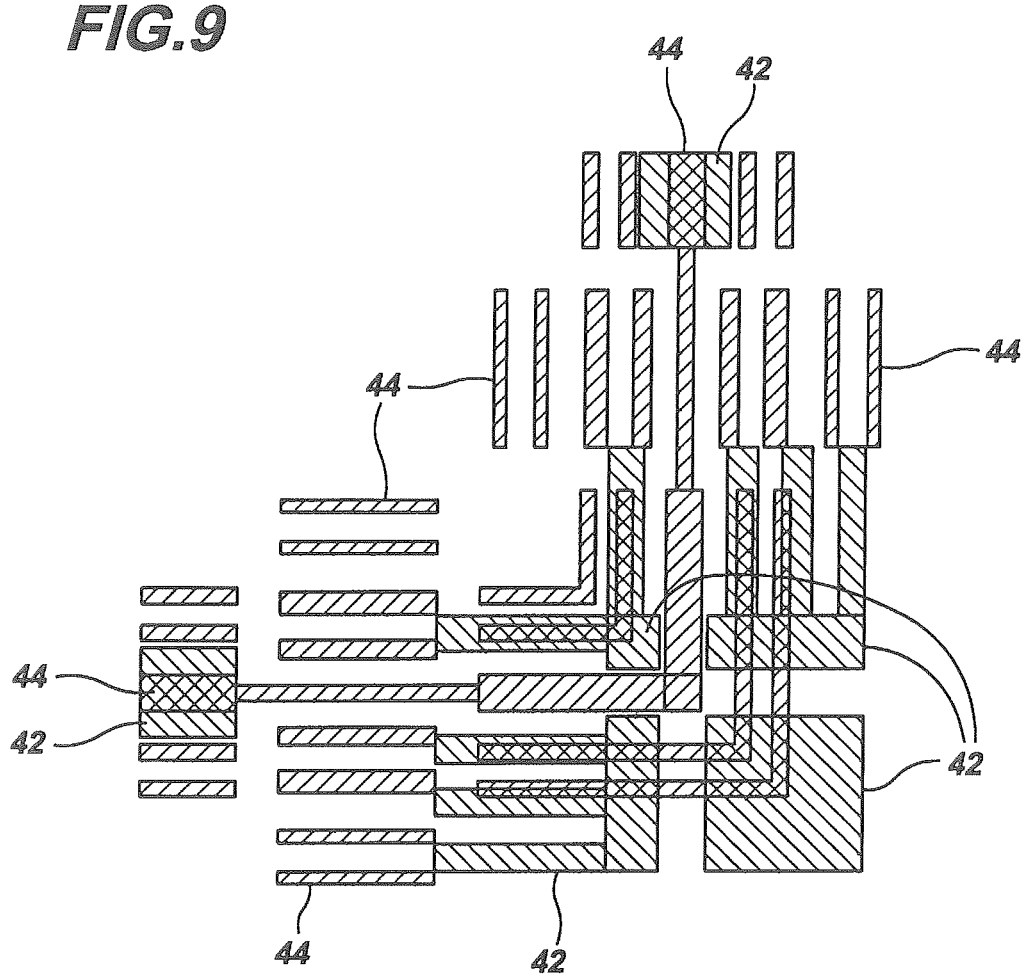
FIG. 9 is a top plan view of overlaid chip-like structures of the present invention after processing of two different masks and lithographic layers.

FIG. 9 depicts the overlay of the chip-like structures RX and PC for levels 1 and 2, respectively. Chip-like structure RX 42 (shown separately in FIG. 4) is on the same mask and layer as and corresponds to optical cross arms 82a-d (FIG. 8) and chip-like structure PC 44 (shown separately in FIG. 4) is on the same mask and layer as and corresponds to optical cross 84 (FIG. 8). The overlay shown is provided in field 40 of the lower right quadrant of the target shown in FIG. 8, and a comparable but opposite overlay would be provided in field 40 of the upper left quadrant of that target. Similarly, in each field 40 chip-like structure CA is provided on the same mask and layer as and corresponds to optical cross aims 83a-d (FIG. 8), and chip-like structure M1 is provided on the same mask and layer as and corresponds to optical cross arms 85 (FIG. 8).

Figure 10:
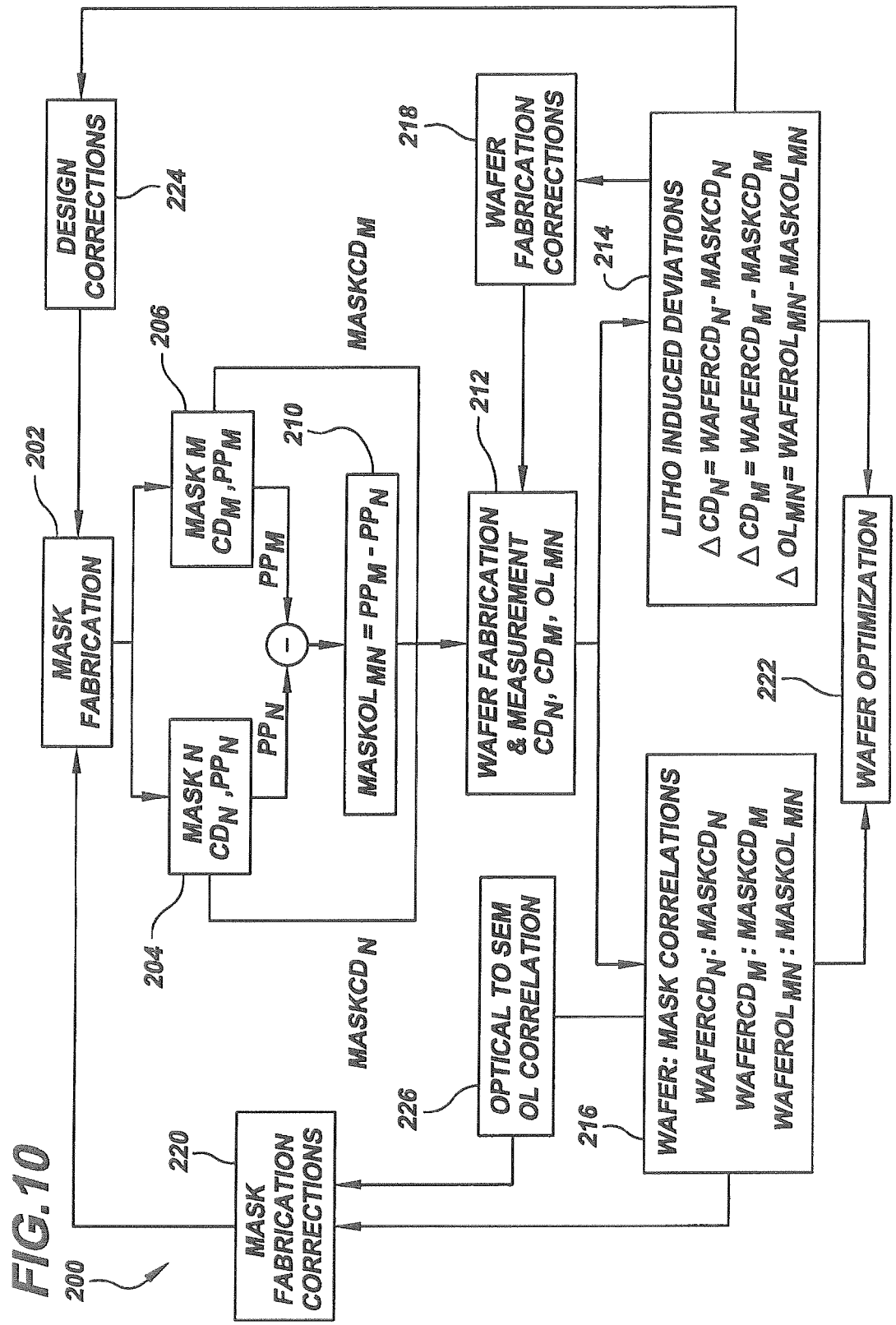
FIG. 10 is a flow chart of the preferred method for determining mask-to-wafer correlation among multiple masking layers of a semiconductor manufacturing process in accordance with the present invention.

FIG. 10 depicts the preferred method 200 for determining mask-to-wafer correlation among multiple masking layers of a semiconductor manufacturing process in accordance with the present invention. The method initially fabricates 202 the masks to be used for the different levels in the semiconductor manufacturing process. Using two masks N and M as an example, mask N 204 has a critical dimension $CD_N$ and a pattern placement $PP_N$, while mask M 206 has a critical dimension $CD_M$ and a pattern placement $PP_M$. The pattern placement errors are then compared 208 by interferometric measurement of the optical structures and the difference is determined 210 to arrive at the mask overlay error $MaskOL_{MN}$ between masks M and N. Measurement is also made of the chip-like structures for critical dimension, $MaskCD_N$ and $MaskCD_M$. The two mask levels are then exposed, developed and printed, and the patterns of the functional chip structures and the integrated target of the present invention are lithographically created on a semiconductor wafer surface. The lithographic processing may include etching, metal and semiconductor deposition, chemical mechanical planarization (CMP) and thermal processing, as well as other conventional processes used in lithographic semiconductor processing. After lithographic creation of the layers, the method measures and determines 212 the wafer critical dimension of layer M, $WaferCD_M$ and the wafer critical dimension of layer N, $WaferCD_N$, from the chip-like structures and the wafer overlay error between layers M and N $WaferOL_{MN}$ from the optical structures.

The lithographically induced errors are determined 214 by taking the difference of $WaferCD_N$ and $MaskCD_N$ to arrive at $\Delta CD_N$, the difference of $WaferCD_M$ and $MaskCD_M$ to arrive at $\Delta CD_M$ and the difference of $WaferOL_{MN}$ and $MaskOL_{MN}$ to arrive at $\Delta OL_{MN}$. These lithographically induced deviations are used as feedback to determine and correct the lithographic processes 218 for the next layers to be deposited. The mask induced errors are then determined 216 by comparing the critical dimension and overlay errors between the wafer and mask, such as correlating the deviation of $WaferCD_M$ to $MaskCD_M$, $WaferCD_N$ to $MaskCD_N$ and $WaferOL_{MN}$ to $MaskOL_{MN}$. These wafer to mask deviations are then used as feedback to determine and correct the mask fabrication 220 for the next layers to be deposited. The determination of both the lithographic and wafer-to-mask deviations then leads to optimization of the wafer 222.

For the optical structures, measurements on the individual layers created by the mask may be done at any point in lithographic processing. For chip-like structures used in overlay measurements, however, typically measurements may not be made at any point in lithographic processing since they will have to be measured using a high resolution metrology tool like SEM or AFM, which can only be employed in post-etch processing steps. These high resolution tools cannot see through deposited levels as optical tools can, and are therefore less useful because after etching it is too late to correct the substrate level. On the other hand, these high resolution tools can still correlate 226 the optical measurement to SEM or AFM measurement of an actual fabricated chip-like structure to provide mask fabrication corrections.

Additionally, in evaluating litho-induced deviations 214, the deviation of wafer critical dimensions and overlay may be compared to the original circuit design. Because of various techniques employed in the mask itself, such as OPC, assist features and the like, the mask patterns may not look anything like the image that is exposed and created on the wafer. Since the mask is more and more distinct from what is actually printed on the wafer, these litho-induced deviations may be used to correct the original design itself 224, rather than just correct the mask.

Figure 11:
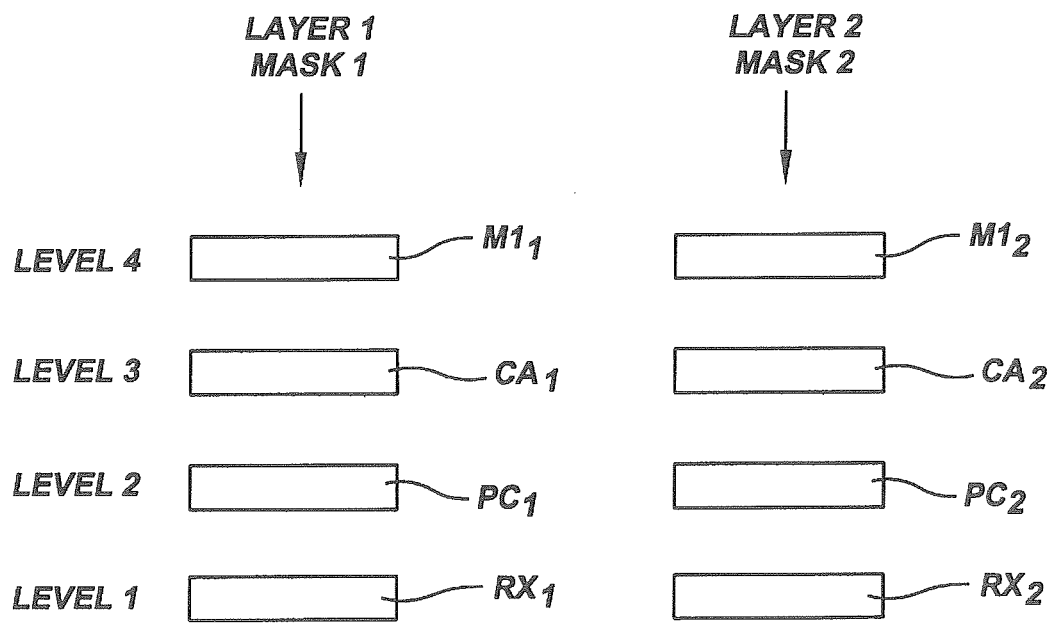
FIG. 11 is a schematic side elevational view of the relationship of lithographic processing layers to levels.

The relationship of layers to levels in lithographic processing is depicted in FIG. 11. Each level 1, 2, 3, 4 represents a distinct physical thickness of a portion of the wafer as shown in a vertical cross-section. To produce each level, one or more processing or patterning layers may be required, each using a separate mask to expose the layer design. As shown in FIG. 11, two patterning layers using two separate masks are use to produce each level. In producing level 1 (e.g., STI level), first mask 1 exposes layer 1 to produce a structure RX1. After the required lithographic processing, mask 2 then exposes layer 2 to produce structure RX2. In doing so, the target and method of the present invention may be used to determine overlay error of the targets of layer 2 with respect to the targets of layer 1. After lithographic processing produces the desired level 1, processing for level 2 (e.g., gate level) begins by exposure and processing of layer 1 thereof by a different mask 1 to produce structure PC1. When using optical microscopy, which can see through different levels and layers, the overlay of the targets of level 1 on layer 2 may be compared to either the targets of layer 2 on level 1, or the targets of layer 1 on level 1, or with the targets of both layer 1 and layer 2 on level 1. When exposing and processing layer 2 on level 2 using a different mask 2, the choices for overlay comparison increase since the targets of this new layer may be compared to the targets of any of the preceding layers and levels. While it is not necessary to make all of these overlay comparisons, the present invention facilitates such comparisons.

Figure 12:
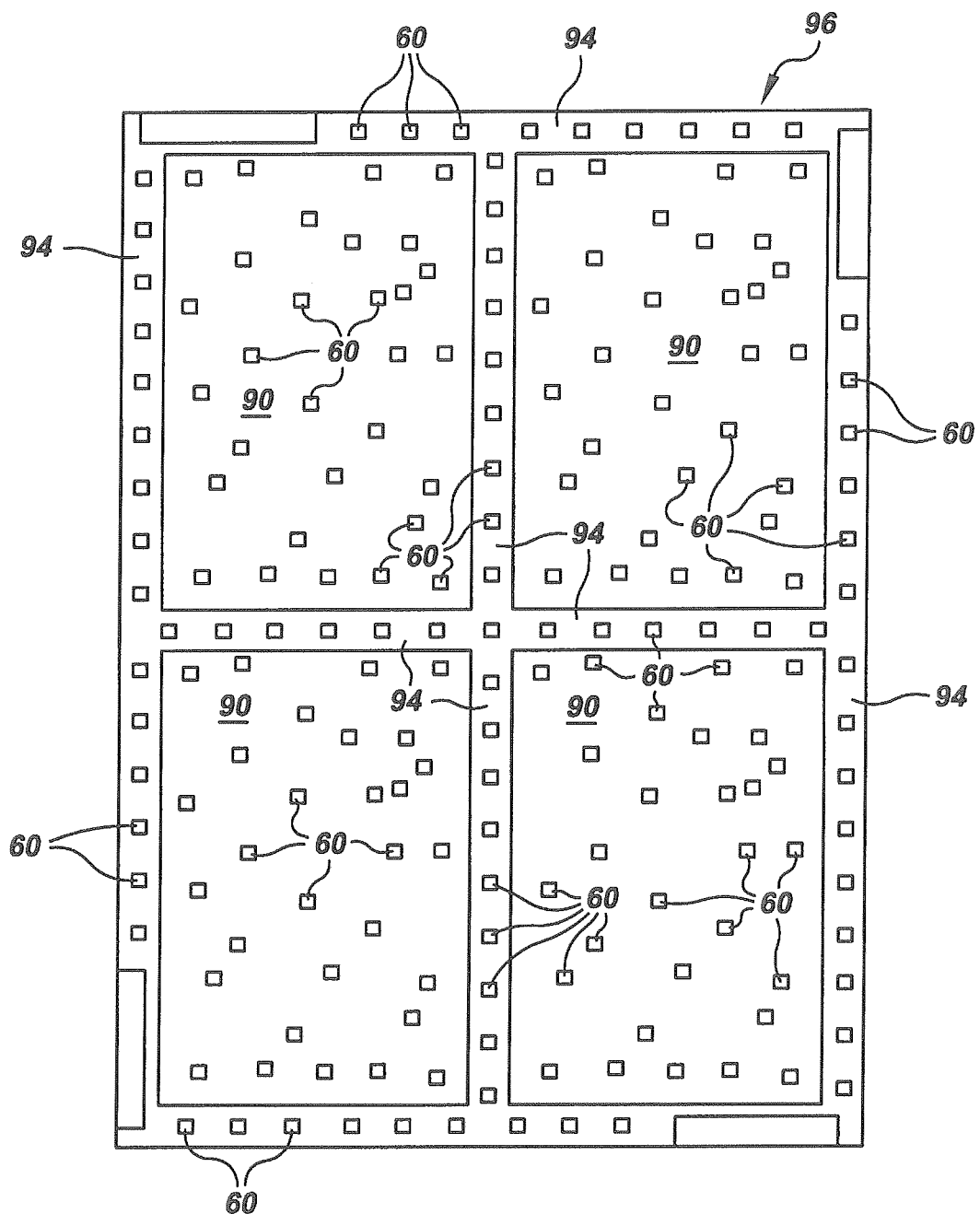
FIG. 12 is a top plan view of the placement of the integrated targets of the present invention in chip and kerf areas of a mask used in lithographic processing.

FIG. 12 shows the exposure field of a multi chip mask having chip areas 90 separated by kerf areas 94 corresponding to the scribe lines at which the chips are eventually separated when the wafer is completed. The chip areas of the mask contain designs for functional circuits and devices (not shown) for the particular layer to be exposed on a wafer substrate level. Interspersed in unused areas within these functional chip structures, as well as within the kerf areas, are the integrated targets 60 of the present invention. Because of the small size of the target, preferably no larger than 10 μm square, the present invention permits higher sampling density for all of these measurements than can be made using the integrated target.

Thus, the present invention provides an improved target and method for determination of overlay error within a chip level which correlates mask-to-wafer variations of critical dimension and overlay and is able to distinguish mask and wafer components of critical dimension and overlay variation. Further, the present invention provides an improved target sufficiently small in size to measures mask and wafer registration, critical dimension at the same physical location to achieve the goal of minimizing on-wafer critical dimension and overlay variation.

While the present invention has been particularly described, in conjunction with specific preferred embodiments, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for mask-to-wafer correlation among multiple masking levels of a semiconductor manufacturing process comprising:
    creating compact targets containing structure patterns suitable for pattern placement, critical dimension and overlay measurement at a set of common locations on two or more patterning layers;
    creating at least two masks containing functional circuit structure patterns and the compact targets at locations between functional circuit structure patterns;
    measuring the targets on the masks;
    determining overlay variation between the masks;
    exposing and creating with one of the masks a first lithographic processing layer on a wafer;
    exposing and creating with another of the masks a second lithographic processing layer on the wafer, over the first layer;
    measuring the targets on the wafer at one or more of the layers;
    correlating the mask and wafer measurements to distinguish mask and lithography induced components of critical dimension and overlay variation.

2. The method of claim 1 further including using the correlated mask and wafer measurements to control the mask and wafer fabrication processes to minimize wafer critical dimension and overlay variation.

3. The method of claim 1 wherein the compact targets include a first set of optical target structures resolvable by optical microscopy when exposed and created on the wafer and a second set of chip-like target structures not resolvable by optical microscopy when exposed and created on the wafer, but resolvable by SEM or AFM microscopy.

4. The method of claim 3 wherein the second set of chip-like target structures comprise non-functional structures in the functional circuit structures, the chip-like target structures selected from the group consisting of shallow trench isolation structures, gate structures, contact structures and metal line structures.

5. The method of claim 4 wherein the second set of chip-like target structures have line widths and spacing not greater than about 200 nm.

6. The method of claim 3 wherein the second set of chip-like target structures have a density gradient ranging from a lower density near the optical structures to a higher density away from the optical structures.

7. The method of claim 3 wherein the first set of optical target structures comprise lines on the masks that are adjacent one another when projected by the masks onto the wafer.

8. The method of claim 3 wherein the first set of optical target structures is used to measure overlay and the second set of chip-like target structures is used to measure critical dimension.

9. The method of claim 3 wherein the first set of optical target structures comprise a first target pattern on one mask having a center at the origin of an orthogonal grid of pitch p, with the sub-patterns of the first target pattern have coordinates of:
    (−M, N) p, (N, M) p, (M, −N) p and (−N, −M) p,
    where N and M are integers, and the distance r of each first target sub-pattern from the center of the first target pattern is defined by the equation:

$$r=p\sqrt{(N^2+M^2)},$$

and wherein a second target pattern on another mask has a center at the same location as the first target pattern, with the sub-patterns of a second target pattern have coordinates of:
    (−M+m, N+n) p, (N+n, M+m) p, (M+m, −N+n) p and (−N+n, −M+m) p,
    where n and m are integers, and $$|n|+|m|=2i,$$

where i is an integer.

10. The method of claim 3 wherein the first set of optical target structures comprise a first target pattern on one mask having a center at the origin of an orthogonal grid and sub-patterns with 180° symmetry, and a second target pattern on another mask having a center at the same location as the first target pattern and sub-patterns with 180° symmetry, the sub-patterns of the second target pattern being located at different locations than the sub-patterns of the first target pattern.

11. The method of claim 1 wherein the target sub-patterns enable pattern specific critical dimension measurements on the masks and wafer, pattern placement measurements on the masks and overlay measurement between two or more layers on the wafer.

12. The method of claim 1 wherein the targets are sufficiently small to be placed within unutilized regions of the chip being manufactured.

13. The method of claim 1 wherein the targets are less than 10 μm on an edge.

14. A method for mask-to-wafer correlation among multiple masking levels of a semiconductor manufacturing process comprising:
    creating compact targets containing structure patterns suitable for pattern placement, critical dimension and overlay measurement at a set of common locations on two or more patterning layers, the compact targets including a first set of optical target structures resolvable by optical microscopy when exposed and created on the wafer and a second set of chip-like target structures not resolvable by optical microscopy when exposed and created on the wafer, but resolvable by SEM or AFM microscopy, the second set of chip-like target structures have line widths and spacing not greater than about 200 nm and a density gradient ranging from a lower density near the optical structures to a higher density away from the optical structures;

creating at least two masks containing functional circuit structure patterns and the compact targets at locations between functional circuit structure patterns;
measuring the targets on the masks;
determining overlay variation between the masks;
exposing and creating with one of the masks a first lithographic processing layer on a wafer;
exposing and creating with another of the masks a second lithographic processing layer on the wafer, over the first layer;
measuring the targets on the wafer at one or more of the layers;
correlating the mask and wafer measurements to distinguish mask and lithography induced components of critical dimension and overlay variation.

15. The method of claim 14 wherein the first set of optical target structures is used to measure overlay and the second set of chip-like target structures is used to measure critical dimension.

* * * * *